US008742829B2

(12) United States Patent
Mottola

(10) Patent No.: US 8,742,829 B2
(45) Date of Patent: Jun. 3, 2014

(54) LOW LEAKAGE DIGITAL BUFFER USING BOOTSTRAP INTER-STAGE

(75) Inventor: Michael Joseph Mottola, San Jose, CA (US)

(73) Assignee: Micrel, Inc., San Jose, CA (US)

( * ) Notice: Subject to any disclaimer, the term of this patent is extended or adjusted under 35 U.S.C. 154(b) by 49 days.

(21) Appl. No.: 13/450,548

(22) Filed: Apr. 19, 2012

(65) Prior Publication Data

US 2013/0278297 A1   Oct. 24, 2013

(51) Int. Cl.
*H03K 17/687* (2006.01)
(52) U.S. Cl.
USPC ............................................. 327/434; 327/112
(58) Field of Classification Search
USPC ............................. 327/108, 112, 434
See application file for complete search history.

(56) References Cited

U.S. PATENT DOCUMENTS

| 5,546,029 A * | 8/1996 | Koke | 327/108 |
| 6,377,089 B1 * | 4/2002 | Loughmiller | 327/112 |
| 7,692,473 B2 * | 4/2010 | Ono | 327/427 |
| 8,461,905 B2 * | 6/2013 | Krauss | 327/427 |
| 8,476,940 B2 * | 7/2013 | Kumar | 327/108 |

* cited by examiner

*Primary Examiner* — Hai L Nguyen
(74) *Attorney, Agent, or Firm* — Van Pelt, Yi & James LLP

(57) ABSTRACT

The present invention is a method and circuitry for driving a high-threshold MOS device on low input voltages. The invention includes a circuit that operates on a supply voltage that is less than the threshold voltage of the high-threshold MOS device. The circuit includes one or more low threshold MOS inverters and one or more capacitors that operate at low input voltages. The one or more low threshold MOS inverters operate in a manner that the one or more capacitors get charged to a voltage greater than the low input voltage. Thereafter, the charged capacitor drives the high threshold MOS device.

8 Claims, 2 Drawing Sheets

LOW LEAKAGE DIGITAL BUFFER USING BOOTSTRAP INTER-STAGE

FIELD OF THE INVENTION

The present invention relates, in general, to the field of IC designing of analog circuits. More specifically, the present invention relates to MOS buffer circuits such as inverter circuits.

BACKGROUND

With the advent of advanced technologies in electronics and communication devices, design and fabrication of Integrated Circuits (ICs) have gained a lot of attention in recent years. ICs form a basic component of almost all modern day electronic devices such as, but not limited to, computers, cell phones, Personal Digital Assistant (PDA), laptops, palmtops, and gaming consoles. Metal Oxide Semiconductor (MOS) inverters form a basic component of any modern day IC. In a typical MOS circuitry, there is often a need for controlling the input (voltage/signal) of the circuitry and maintaining the voltage/signal above a threshold value for an optimal functioning of the MOS inverter. In addition, it is also desirable to design ICs with MOS inverters that operate at lower voltages than the current input voltage ratings. In some of the existing ICs, this has been accomplished by generating inverted or complement signals of a timing signal, where the inverted or complement signal has the same magnitude as the threshold voltage required for powering the ICs.

Bootstrapping is a well-known technique used in the ICs with MOS circuits for generating a voltage greater than the potential applied to the circuit. It is often used to avoid the effects of the potential drop of a MOS device below a threshold level. Existing bootstrap circuits utilize a capacitor to raise the potential on the gate of a MOS device to a potential greater than the potential across the source and drain of the MOS device so that the effects of the threshold drop may be reduced. Typically, to bootstrap an output circuit element, current is supplied to the output circuit element when it is not supplying an output signal. Further, if the threshold voltage of the circuit element is large, the standby power consumed by the circuit leads to inefficiency.

In light of the above discussion, there is a need for providing a circuitry that renders the ICs with MOS circuits operable at lower voltages and that addresses at least the above-mentioned shortcomings.

SUMMARY

An object of the present invention is to provide a method and a circuitry for enhancing low-voltage supply capability for a high-threshold MOS inverter so that it may be operated at voltages less than its threshold voltage.

Another object of the invention is to provide a circuitry for driving a high-threshold inverter such that the circuitry has a low OFF leakage.

Yet another object of the invention is to provide a voltage supply circuitry for a high-threshold inverter so that the circuitry may be efficiently used with single supply low-voltage Low-Dropout (LDO) regulators.

Disclosed embodiments of the invention provide a circuit for driving a high threshold MOS device. The circuit includes a first inverter, where an output terminal of the first inverter is connected to an input terminal of the high threshold MOS device. Further, the circuit includes a first diode connected between a first supply rail and a power terminal of the first inverter. A second diode is connected between a second supply rail and a ground terminal of the first inverter. Additionally the circuit includes a pair of capacitors connected in series and between the first diode and the second diode. A first input line is connected to an input terminal of the first inverter. Finally, the circuit includes a second input line connected between the pair of capacitors.

Various embodiments of the invention disclose a circuit for operating a high threshold MOS device on a low supply voltage. The circuit includes a first inverter that is connected to the high threshold MOS device. The first inverter operates at low threshold voltage in comparison to the high threshold MOS device. Thus, the circuit would have low leakage current in an off-state. Further, charging and discharging of a first capacitor and a second capacitor in the circuit enables the high threshold MOS device to operate on a low supply voltage line.

BRIEF DESCRIPTION OF THE DRAWINGS

Various embodiments of the present invention will hereinafter be described in conjunction with the appended drawings that are provided to illustrate, and not to limit, the present invention, wherein like designations denote like elements, and in which.

Skilled artisans will appreciate that the elements in the figures are illustrated for simplicity and clarity to help improve the understanding of the embodiments of the present invention and are not intended to limit the scope of the present invention in any manner whatsoever.

DETAILED DESCRIPTION OF THE INVENTION

Figure 1:
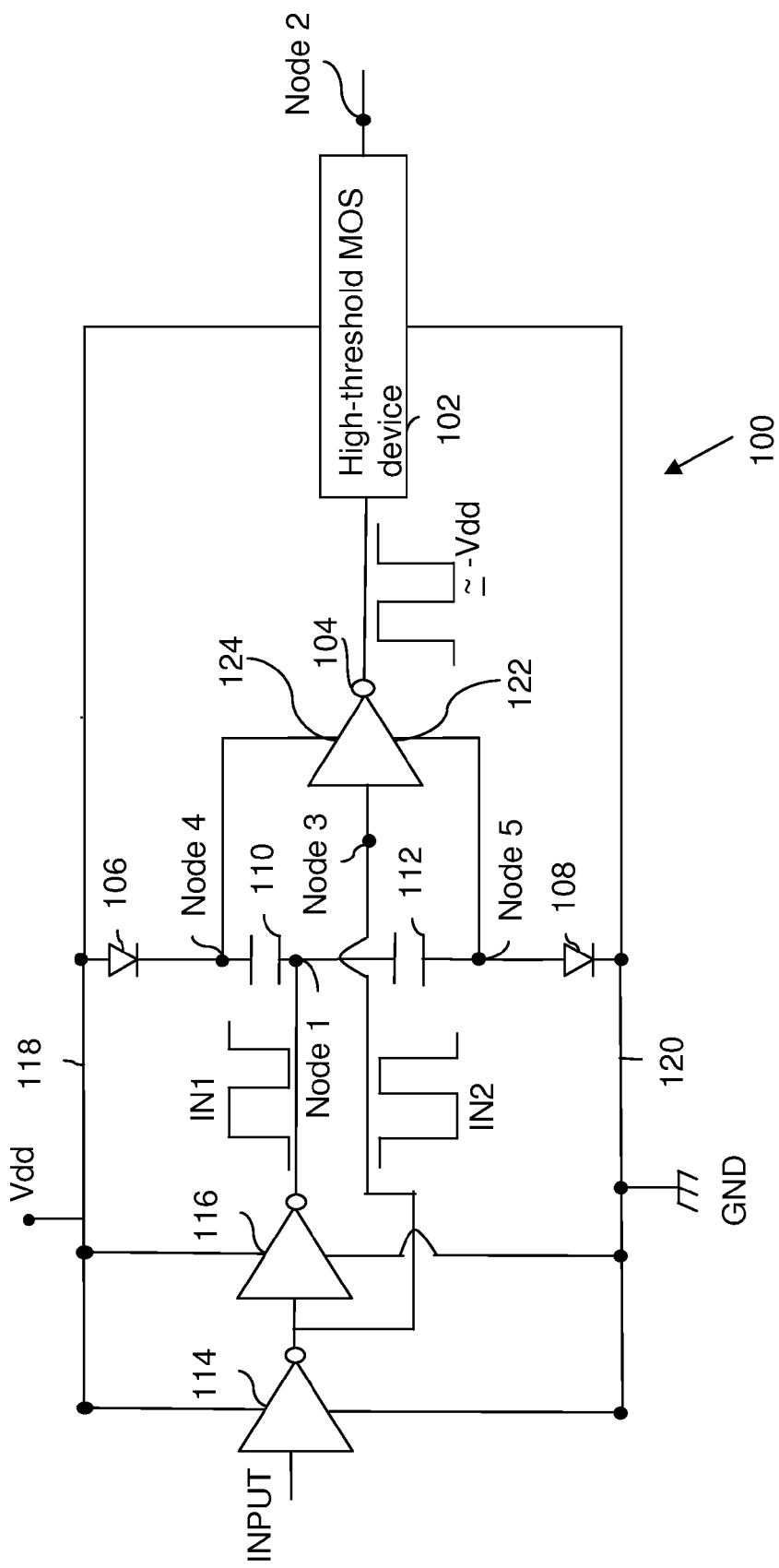
FIG. 1 depicts a circuitry for driving a high threshold MOS inverter at voltages below a threshold voltage.

FIG. 1 depicts a circuit 100 for driving a high-threshold MOS device 102 at voltages below a threshold voltage. The circuit 100 includes a first inverter 104, a first diode 106, a second diode 108, a first capacitor 110, a second capacitor 112, a second inverter 114, and a third inverter 116.

An output terminal of the first inverter 104 is connected to an input terminal of the high threshold MOS device 102. The power terminal 124 of the first inverter 104 is connected to a cathode terminal of the first diode 106. Further, an anode terminal of the first diode 106 is connected to a first supply rail 118. Similarly, a ground terminal 122 of the first inverter 104 is connected to an anode terminal of the second diode 108. A cathode terminal of the second diode 108 is connected to a second supply rail 120. The first supply rail 118 is further connected to a positive terminal ($V_{dd}$), and the second supply rail 120 is further connected to a ground terminal (GND). In an exemplary embodiment of the invention, the first diode 106 and the second diode 108 are Schottky diodes.

The cathode terminal of the first diode 106 and the anode terminal of the second diode 108 are connected to the series connection of the first capacitor 110 and the second capacitor 112. A first terminal of the series connection is connected to the cathode terminal of the first diode 106, and a second terminal of the series connection is connected to the anode terminal of the second diode 108. An input terminal of the first inverter 104 is connected to an output terminal of the second inverter 114 through node 3. Further, an output terminal of the high threshold MOS device 102 is connected to node 2. Furthermore, the first capacitor 110, the second capacitor 112, and an output terminal of the third inverter 116 are connected at node 1. Further, node 4 connects to the cathode of the first diode 106, the first capacitor 110, and a power terminal 124 of the first inverter 104. Further, node 5 connects to the anode of the second diode 108, the second capacitor 112, and a ground terminal 122 of the first inverter 104. The positive terminal ($V_{dd}$) connects to the power terminals of the second inverter 114, the third inverter 116 and the high threshold MOS device 102. The positive terminal ($V_{dd}$) also connects to the anode terminal of the first diode 106. The GND connects with the ground terminals of the second inverter 114, the third inverter 116 and the high threshold MOS device 102 The GND also connects to the cathode terminal of the second diode 108. For a person skilled in the art, it is will be apparent that the positive terminal ($V_{dd}$) has a higher positive potential than that of the GND. In an embodiment, the high threshold MOS device 102 triggers at voltages greater than $V_{dd}$ or at voltages less than GND. In an embodiment, the first inverter 104, the second inverter 114, and the third inverter 116 are low threshold MOS devices that trigger at voltages less than $V_{dd}$.

In an embodiment of the present invention, each of the high threshold MOS device 102, the first inverter 104, the second inverter 114, and the third inverter 116 includes a plurality of MOS devices. In another embodiment of the present invention, each of the high threshold MOS device 102, the first inverter 104, the third inverter 116, and the second inverter 114 includes one N-channel MOS device and one P-channel MOS device. The N-channel MOS device's source terminal connects to the ground terminal, and the P-channel MOS device's source terminal connects to the $V_{dd}$ terminal. The drain terminals of the N-channel MOS device and the P-channel MOS device are connected to the respective output terminal of each one of the high threshold MOS device 102, the first inverter 104, the second inverter 114, and the third inverter 116. The gate terminal of the N-channel MOS device and the P-channel MOS device connect to the respective input terminal of each one of the high threshold MOS device 102, the first inverter 104, the second inverter 114, and the third inverter 116.

In another embodiment of the invention, each of the second inverter 114 and the third inverter 116 includes a plurality of low threshold MOS transistors. In a further embodiment, each of the second inverter 114 and the third inverter 116 includes at least one bipolar junction transistor.

For a person skilled in the art, it will be understood that a potential of $V_{in}<V_{dd}/2$ at an inverter input terminal will cause the potential at the output terminal of the inverter to be at or near ground. Further, a potential of $V_{in}>V_{dd}/2$ at an inverter input terminal will cause the output terminal potential to be at or near $V_{dd}$. In operation, the second inverter 114 receives a signal from an external source. The second inverter 114 inverts the signal and transmits the inverted signal to the third inverter 116 and to node 3. The third inverter 116 inverts the inverted signal to generate a second inverted signal. In an embodiment, the second inverted signal is in phase with the signal received by the second inverter 114 from the external source. In an embodiment, the signal from second inverter 114 is received directly at node 3. The signal generated by the third inverter 116 is applied at node 1. In an embodiment of the invention, the signal from second inverter 114 and third inverter 116 is a square wave signal. It should be appreciated by a person skilled in the art that the signal at node 1 and node 3 are 180° out of phase. Further, it should be appreciated by a person skilled in the art that the potential at node 1 and node 3 varies from GND to $V_{dd}$ in subsequent cycles.

For instance, the potential of the inverted signal at node 3 is $V_{dd}$. Thus, the potential of the signal at node 1 is 0V. Since, the potential at node 1 is 0V, the first diode 106 is in a forward biased state. The first capacitor 110 and the second capacitor 112 will get charged to a potential $V_{dd}-V_{diode}$. It should be appreciated by a person skilled in the art that the first capacitor 110 gets charged in a manner that the potential of the terminal of the first capacitor 110 connected the first diode 106 is equal to $V_{dd}-V_{diode}$. Similarly, the potential of the terminal of the second capacitor 112, connected to the second diode 108, is equal to $-V_{dd}+V_{diode}$. Thus, the potential at node 5 is $-V_{dd}+V_{diode}$.

At a subsequent time, the potential of the inverted signal at node 3 is 0V and the potential of the signal at node 1 is $V_{dd}$. Thus, total potential at node 4 is $2V_{dd}-V_{diode}$.

The potential at the power terminal 124 and the ground terminal 122 of the first inverter 104 is $2V_{dd}-V_{diode}$ and $-V_{dd}+V_{diode}$ respectively based on the inverted signal at node 3. Thus, the output of the first inverter 104 will vary from $2V_{dd}-V_{diode}$ to $-V_{dd}+V_{diode}$ based on the inverted signal applied at node 3. For example, if the voltage at node 3 is $V_{dd}$, the voltage at the output terminal of the first inverter 104 will be $-V_{dd}+V_{diode}$. Similarly, if the voltage at node 3 is 0V, the voltage at the output terminal of the first inverter 104 will be $2V_{dd}-V_{diode}$.

A person skilled in the art would appreciate that the voltage potential at node 4 and node 5 is applied at the power terminal 124 and ground terminal 122 of the first inverter 104 respectively. Therefore, the signal generated by the first inverter 104 will vary from $2V_{dd}-V_{diode}$ to $-V_{dd}+V_{diode}$. Further, the upper voltage limit of the signal generated by the first inverter 104 is $>V_{dd}$ and the lower voltage limit of the signal generated by the first inverter 104 is <Gnd. Therefore, the signal generated by the first inverter 104 will drive the high threshold MOS device 102.

Figure 2:
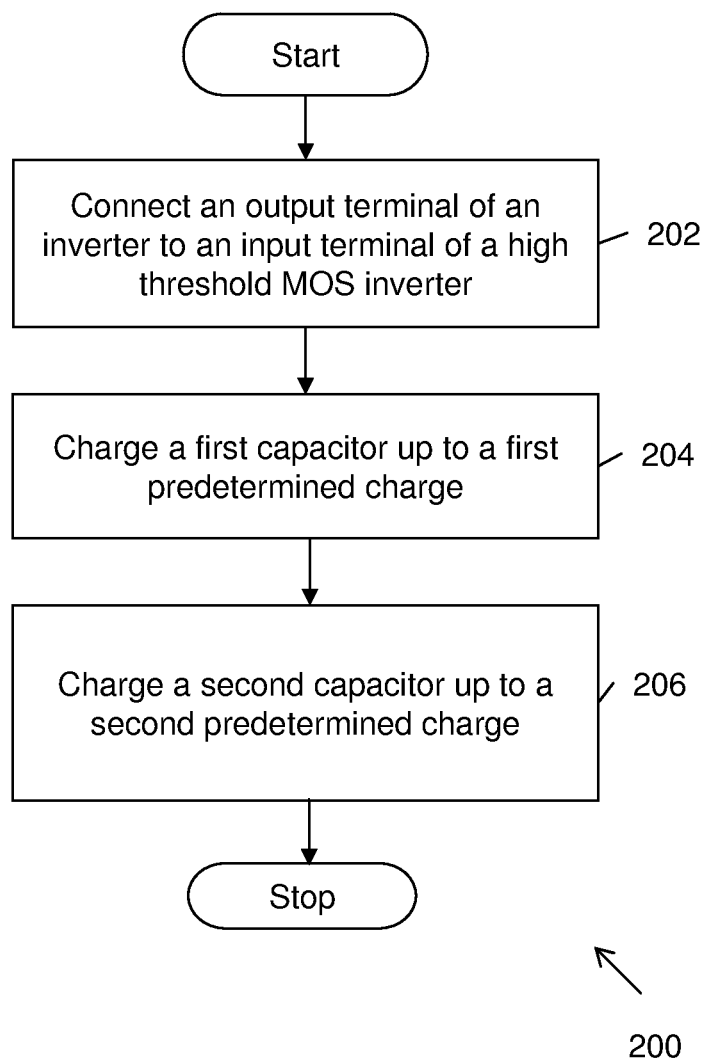
FIG. 2 depicts a flowchart illustrating a method for driving the high-threshold MOS inverter at voltages below a threshold voltage.

FIG. 2 depicts a flowchart 200 illustrating a method for driving the high-threshold MOS device 102 at voltages less than the threshold voltage. Although the method illustrated in FIG. 2 is explained with reference to the system of FIG. 1, it will be apparent for a person skilled in the art that the method may be accomplished by different embodiments that are intended to be encompassed within the spirit and scope of the present invention.

At step 202, an output terminal of the first inverter 104 (refer FIG. 1) is connected to an input terminal of the high-threshold MOS device 102. The high-threshold MOS device 102 is driven by the signal received from the output terminal of the first inverter 104.

At step 204, the first capacitor 110 is charged up to a first predetermined charge when the ground terminal 122 of the first inverter 104 is in contact with the output terminal of the first inverter 104, so that the potential at the ground terminal 122 is equivalent to charge stored in the second capacitor 112. A person skilled in the art would appreciate that when the signal at node 3 is at high potential (Vdd), the NMOS device in the inverter 104 will be activated so that the potential at the output terminal of the inverter 104 is the same as the potential at the ground terminal 122.

At step 206, the second capacitor 112 is charged up to a second predetermined charge when the power terminal 124 of the first inverter 104 is in contact with the output terminal of the first inverter 104. A person skilled in the art would appreciate that when the signal at node 3 is at low potential (GND), the PMOS device in the inverter 104 will be activated so that the potential at the output terminal of the inverter 104 is the same as the potential at the power terminal 124. Further, the potential at the power terminal 124 is equivalent to a sum of charge stored in the first capacitor 110 and charge supplied by a power supply $V_{dd}$. In an embodiment of the invention, driving the high-threshold MOS device 102 further includes connecting an input to the first capacitor 110 and the second capacitor 112 at node 3. In accordance with the embodiment, the first capacitor 110 is charged from the power supply through a first diode 106 when node 1 is at low potential. Further, the second capacitor 112 is charged from the input line when node 1 is at high potential.

The disclosed circuit and method provide a circuit that drives a high-threshold MOS device at a low supply voltage. Further, the high-threshold MOS device is driven by a low-threshold MOS inverter such as the first inverter 104. It should be appreciated by a person skilled in the art that since, the first inverter 104 is a low threshold MOS inverter, therefore the Width(W)/Length(L) ratio of the first inverter 104 is less than the W/L ratio of the high-threshold MOS device 102. Thus, leakage current associated with the first inverter 104 is less in comparison to the leakage current associated with the high-threshold MOS device 102. The circuit and method further allow the inputs to the high-threshold MOS device 102 to operate at a potential that is greater than $V_{dd}$ and potential lower than GND so that the high-threshold MOS inverter can operate as a high-current buffer at lower input voltages (e.g. $V_{dd}$).

While various embodiments of the invention have been illustrated and described, it will be clear that the invention is not limited only to these embodiments. Numerous modifications, changes, variations, substitutions, and equivalents will be apparent to those skilled in the art, without departing from the spirit and scope of the invention.

What is claimed is:

1. A circuit for driving an MOS device, the MOS device having an input terminal configured to receive a first signal in phase with an input signal and an output terminal configured to provide an output signal, the circuit comprising:
   a first inverter having an input terminal configured to receive a second signal indicative of an inverse of the input signal and an output terminal configured to provide the first signal coupled to drive the input terminal of the MOS device, the first inverter having a power terminal and a ground terminal;
   a first diode having an anode terminal connected to a first supply rail providing a first supply voltage and a cathode terminal connected to the power terminal of the first inverter;
   a second diode having an anode terminal connected to the ground terminal of the first inverter and a cathode terminal connected to a second supply rail providing a second supply voltage; and
   first and second capacitors connected in series between the power terminal and the ground terminal of the first inverter, a first node between the first and second capacitors being configured to receive a third signal in phase with the input signal.

2. The circuit of claim 1, wherein the first supply voltage comprises a positive power supply voltage and the second supply voltage comprises a ground potential.

3. The circuit of claim 1, further comprising:
   a second inverter configured to receive the input signal and to generate the second signal being an inverse of the input signal; and
   a third inverter configured to receive the second signal and to generate the third signal being indicative of the input signal.

4. The circuit of claim 1, wherein the output signal of the MOS device comprises an inverse of the input signal.

5. The circuit of claim 1, wherein the first diode and the second diode comprise one of PN junction diodes or Schottky diodes.

6. The circuit of claim 1, wherein the first capacitor is charged up to the first supply voltage when the input signal has a first logical state and the power terminal of the first inverter is boosted to a voltage greater than the first supply voltage when the input signal switches from the first logical state to a second logical state, opposite the first logical state.

7. The circuit of claim 6, wherein the second capacitor is charged up to the first supply voltage when the input signal has the second logical state and the ground terminal of the first inverter is boosted to a voltage lower than the second supply voltage when the input signal switches from the second logical state to the first logical state.

8. The circuit of claim 7, wherein the MOS device comprises:
   a first PMOS transistor and a first NMOS transistor connected in series between the first supply rail and the second supply rail, gate terminals of the first PMOS transistor and the first NMOS transistor being connected together as the input terminal of the MOS device, drain terminals of the first PMOS transistor and the first NMOS transistor being connected together as the output terminal of the MOS device,
   wherein the first inverter provides a voltage lower than the second supply voltage to the gate terminal of the PMOS transistor to turn on the PMOS transistor in response to the input signal having the first logical state, the MOS device providing the output signal having the second logical signal; and the first inverter provides a voltage greater than the first supply voltage to the gate terminal of the NMOS transistor to turn on the NMOS transistor in response to the input signal having the second logical state, the MOS device providing the output signal having the first logical signal.

* * * * *